(12) United States Patent
Derrickson et al.

(10) Patent No.: US 11,094,805 B2
(45) Date of Patent: Aug. 17, 2021

(54) LATERAL HETEROJUNCTION BIPOLAR TRANSISTORS WITH ASYMMETRIC JUNCTIONS

(71) Applicant: GLOBALFOUNDRIES U.S. Inc., Santa Clara, CA (US)

(72) Inventors: Alexander Derrickson, Troy, NY (US); Edmund K. Banghart, Pittsford, NY (US); Alexander Martin, Greenfield Center, NY (US); Ryan Sporer, Mechanicville, NY (US); Jagar Singh, Clifton Park, NY (US); Katherina Babich, Cold Spring, NY (US); George R. Mulfinger, Wilton, NY (US)

(73) Assignee: GLOBALFOUNDRIES U.S. INC., Santa Clara, CA (US)

(*) Notice: Subject to any disclaimer, the term of this patent is extended or adjusted under 35 U.S.C. 154(b) by 0 days.

(21) Appl. No.: 16/745,833

(22) Filed: Jan. 17, 2020

(65) Prior Publication Data

US 2021/0226044 A1    Jul. 22, 2021

(51) Int. Cl.
| | |
|---|---|
| *H01L 29/737* | (2006.01) |
| *H01L 29/08* | (2006.01) |
| *H01L 21/324* | (2006.01) |
| *H01L 29/165* | (2006.01) |
| *H01L 29/66* | (2006.01) |

(Continued)

(52) U.S. Cl.
CPC ...... *H01L 29/737* (2013.01); *H01L 21/02532* (2013.01); *H01L 21/324* (2013.01); *H01L 29/0817* (2013.01); *H01L 29/0821* (2013.01); *H01L 29/1004* (2013.01); *H01L 29/165* (2013.01); *H01L 29/66242* (2013.01)

(58) Field of Classification Search
CPC . H01L 29/737; H01L 21/324; H01L 29/0817; H01L 29/165; H01L 29/66242; H01L 29/0821; H01L 29/1004; H01L 21/02532
See application file for complete search history.

(56) References Cited

U.S. PATENT DOCUMENTS

| | | |
|---|---|---|
| 8,441,084 B2 | 5/2013 | Cai et al. |
| 9,059,016 B1 * | 6/2015 | Hekmatshoar-Tabari ........ H01L 29/1008 |
| 9,437,718 B1 | 9/2016 | Cai et al. |

(Continued)

*Primary Examiner* — Syed I Gheyas
(74) *Attorney, Agent, or Firm* — Thompson Hine LLP; Anthony Canale

(57) ABSTRACT

Structures for a heterojunction bipolar transistor and methods of forming a structure for a heterojunction bipolar transistor. A first portion of a first semiconductor layer defines an emitter, a first portion of a second semiconductor layer defines a collector, and a base includes respective second portions of the first and second semiconductor layers that are laterally positioned between the first portion of the first semiconductor layer and the first portion of the second semiconductor layer. The first portion of the first semiconductor layer has a first thickness, and the first portion of the second semiconductor layer has a second thickness that is greater than the first thickness. The first portion and the second portion of the first semiconductor layer adjoin at a first junction having the first thickness. The first portion and the second portion of the second semiconductor layer adjoin at a second junction having the second thickness.

20 Claims, 3 Drawing Sheets

(51) Int. Cl.
*H01L 21/02* (2006.01)
*H01L 29/10* (2006.01)

(56) References Cited

U.S. PATENT DOCUMENTS

| | | |
|---|---|---|
| 9,525,027 B2 | 12/2016 | Hashemi et al. |
| 10,014,397 B1 | 7/2018 | Jain et al. |
| 2015/0263091 A1* | 9/2015 | Hashemi ............ H01L 21/2254 257/191 |

* cited by examiner

LATERAL HETEROJUNCTION BIPOLAR TRANSISTORS WITH ASYMMETRIC JUNCTIONS

BACKGROUND

The invention relates generally to semiconductor devices and integrated circuit fabrication and, in particular, to structures for a heterojunction bipolar transistor and methods of forming a structure for a heterojunction bipolar transistor.

A bipolar junction transistor is a multi-terminal electronic device that includes an emitter, a collector, and an intrinsic base arranged between the emitter and collector. In a PNP bipolar junction transistor, the emitter and collector are composed of p-type semiconductor material, and the intrinsic base is composed of n-type semiconductor material. In an NPN bipolar junction transistor, the emitter and collector are composed of n-type semiconductor material, and the intrinsic base is composed of p-type semiconductor material. During operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials of the terminals have different energy bandgaps, which defines heterojunctions. For example, the collector and/or emitter of a heterojunction bipolar transistor may be constituted by silicon, and the intrinsic base of a heterojunction bipolar transistor may contain a silicon-germanium alloy, which is characterized by a narrower band gap than silicon.

Although existing structures have proven suitable for their intended purpose, improved structures for a heterojunction bipolar transistor and methods of forming a structure for a heterojunction bipolar transistor are needed.

SUMMARY

In an embodiment of the invention, a structure for a heterojunction bipolar transistor is provided. An emitter of the structure includes a first portion of a first semiconductor layer, a collector of the structure includes a first portion of a second semiconductor layer, and a base of the structure including a second portion of the first semiconductor layer and a second portion of the second semiconductor layer that are laterally positioned between the first portion of the first semiconductor layer and the first portion of the second semiconductor layer. The first portion of the first semiconductor layer has a first thickness, and the first portion of the second semiconductor layer has a second thickness that is greater than the first thickness. The first portion and second portion of the first semiconductor layer adjoin at a first junction having the first thickness. The first portion and the second portion of the second semiconductor layer adjoin at a second junction having the second thickness.

In an embodiment of the invention, a method of forming a structure for a heterojunction bipolar transistor is provided. The method includes forming a hardmask layer over a first semiconductor layer in a first device area, epitaxially growing an epitaxial semiconductor layer containing germanium on a second device area of the first semiconductor layer, and transferring the germanium from the epitaxial semiconductor layer to the second device area of the device layer in the first device area to form a second semiconductor layer. A first portion of the first semiconductor layer defines an emitter of the structure, and a first portion of the second semiconductor layer defines a collector of the structure. A base of the structure includes a second portion of the first semiconductor layer and a second portion of the second semiconductor layer that are laterally positioned between the first portion of the first semiconductor layer and the first portion of the second semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
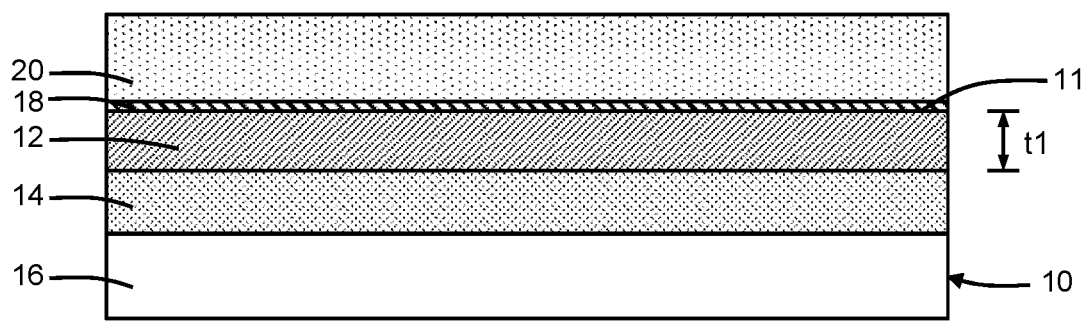
FIGS. 1-5 are cross-sectional views of a structure at successive fabrication stages of a processing method in accordance with embodiments of the invention.

With reference to FIG. 1 and in accordance with embodiments of the invention, a substrate 10 in the representative form of a semiconductor-on-insulator (SOI) substrate includes a device layer 12 defining a semiconductor layer, a buried insulator layer 14, and a handle wafer 16. The device layer 12 is separated from the handle wafer 16 by the intervening buried insulator layer 14 and is considerably thinner than the handle wafer 16. The device layer 12 and the handle wafer 16 may be composed of a single-crystal semiconductor material, such as single-crystal silicon, and may be lightly doped to have, for example, p-type conductivity. The buried insulator layer 14 may be composed of a dielectric material, such as silicon dioxide. The buried insulator layer 14 has a lower surface in direct contact with the handle wafer 16 along an interface and an upper surface in direct contact with the device layer 12 along another interface, and the lower and upper surfaces are separated by the thickness of the buried insulator layer 14 and terminate at the rim of the substrate 10. The device layer 12 is electrically isolated from the handle wafer 16 by the buried insulator layer 14. The device layer 12 has a thickness, t1, between the buried insulator layer 14 and its top surface 11. In an embodiment, the thickness of the device layer 12 may range from about 3 nanometers (nm) to about 200 nm.

Pad layers 18, 20 are formed in a layer stack on a top surface of the device layer 12. The pad layer 18 may be composed of a dielectric material, such as silicon dioxide, grown by thermal oxidation of the device layer 12. The pad layer 20 may be composed of a dielectric material, such as silicon nitride, that is deposited on the pad layer 18, and the pad layer 20 may subsequently function as a hardmask.

Figure 2:
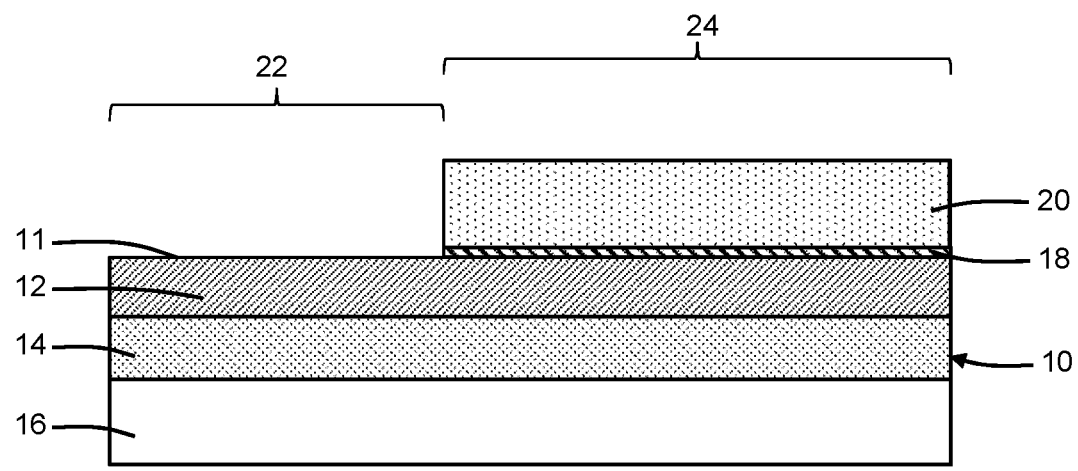

With reference to FIG. 2 in which like reference numerals refer to like features in FIG. 1 and at a subsequent fabrication stage, the pad layers 18, 20 are removed from a device area 22 to expose a portion of the device layer 12. Another portion of the device layer 12 is fully covered by the pad layers 18, 20 in a device area 24. The pad layers 18, 20 may be patterned by lithography and etching processes in which an etch mask is formed by lithography that covers the pad layers 18, 20 in the device area 24 and one or more etching processes, such as a wet chemical and/or reactive ion etching processes, are applied to remove the non-masked portions of the pad layers 18, 20 in device area 22. The unmasked portions of the pad layers 18, 20 may be etched and removed selective to the device layer 12. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The pad layers 18, 20 in the device area 24 are protected by the etch mask during the one or more etching processes. The etch mask is stripped after patterning the pad layers 18, 20.

Figure 3:
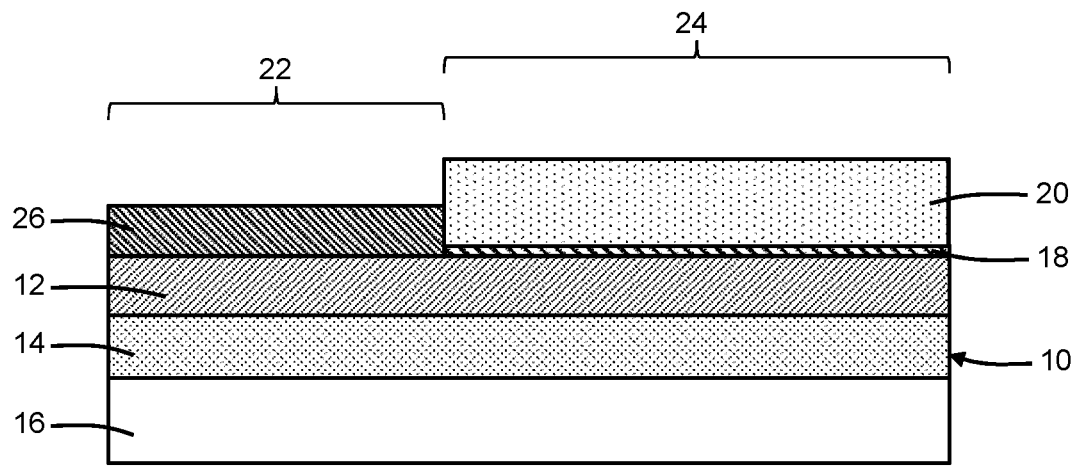

With reference to FIG. 3 in which like reference numerals refer to like features in FIG. 2 and at a subsequent fabrication stage, an epitaxial semiconductor layer 26 is formed by epitaxial growth from the device layer 12 in the device area 22. In device area 22, the epitaxial semiconductor layer 26 is in direct contact with the top surface of the device layer 12, which provides the crystal structure serving as a template for epitaxial growth. In an embodiment, the epitaxial semiconductor layer 26 may contain germanium and, in particular, the epitaxial semiconductor layer 26 may be composed of silicon-germanium (SiGe) having a germanium concentration (i.e., the ratio of the germanium content to the germanium and silicon content) ranging from 2% to 50%. The epitaxial semiconductor layer 26 may be formed using an epitaxial growth process, such as a selective epitaxial growth process in which the constituent semiconductor material nucleates for epitaxial growth from semiconductor surfaces, but does not nucleate for epitaxial growth from insulator surfaces (e.g., the top surface of the pad layer 20).

Figure 4:
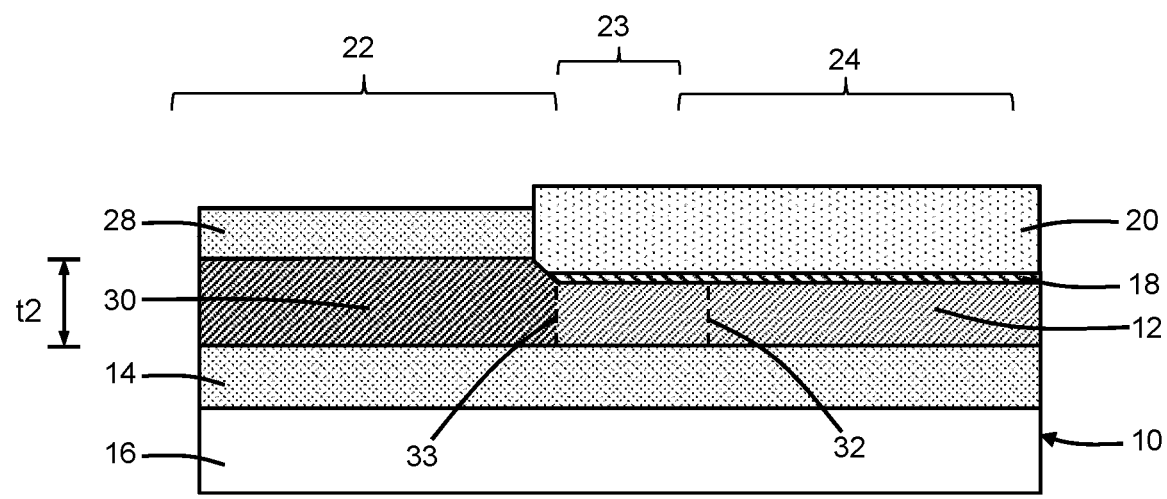

With reference to FIG. 4 in which like reference numerals refer to like features in FIG. 3 and at a subsequent fabrication stage, the device layer 12 in the device area 22 is modified in its composition using a thermal oxidation process to form a semiconductor layer 30. The thermal oxidation process causes the epitaxial semiconductor layer 26 in device area 22 to at least partially combine with the underlying semiconductor material of the device layer 12 to form the semiconductor layer 30. The semiconductor layer 30 in device area 22 may extend to the buried insulator layer 14 and may be in direct contact with the buried insulator layer 14. In that regard, the full thickness of the device layer 12 in device area 22 may be locally modified by the thermal oxidation process to form the semiconductor layer 30. The semiconductor layer 30 has a thickness, t2, measured between the buried insulator layer 14 and its top surface 31. The semiconductor layer 30 and the device layer 12 are each positioned over the buried insulator layer 14 and may be in direct contact with the buried insulator layer 14 with coplanar bottom surfaces.

The semiconductor layer 30 is composed of a single-crystal semiconductor material having a different composition than the single-crystal semiconductor material of the device layer 12 in device area 24. For example, the semiconductor layer 30 may be composed of a semiconductor material having a higher carrier mobility (e.g., hole mobility) than the semiconductor material of the device layer 12. As a more specific example, the semiconductor layer 30 may be composed of silicon-germanium, which has a higher carrier mobility than silicon composing the device layer 12.

In an embodiment, the thermal oxidation process producing the semiconductor layer 30 is a condensation process that causes germanium atoms to be transported (e.g., diffused) from the epitaxial semiconductor layer 26 into the section of the device layer 12 in device area 22. The thermal oxidation process may be performed with the substrate 10 placed, during rapid heating, in an ambient atmosphere having an oxygen content. During the thermal oxidation process, the epitaxial semiconductor layer 26 oxidizes across its thickness beginning at its top surface and advancing toward the interface with the underlying device layer 12. Germanium atoms are irreversibly transported from the epitaxial semiconductor layer 26 into the underlying device layer 12 as oxidation proceeds such that the semiconductor layer 30 composed of single-crystal silicon-germanium is formed by germanium enrichment. Condensation is based upon, among other factors, germanium and silicon each having diamond lattice structures and the different chemical affinities between germanium and silicon with respect to oxygen. The buried insulator layer 14 rejects the diffusion of germanium such that the germanium displaced from the epitaxial semiconductor layer 26 is located entirely (i.e., is confined) in the semiconductor layer 30.

The epitaxial semiconductor layer 26 is converted into an oxidized remnant layer 28 that is depleted of germanium (e.g., silicon dioxide), and the section of the device layer 12 receiving the germanium is converted into a germanium-enriched semiconductor material (e.g., silicon-germanium) constituting the semiconductor layer 30. The germanium concentration in the semiconductor layer 30 and the thickness of the semiconductor layer 30 depend on, among other factors, the germanium content and thickness of the epitaxial semiconductor layer 26 and the thickness of the device layer 12. The properties of the semiconductor layer 30 may also depend on the duration of the thermal oxidation process.

The semiconductor layer 30 may have a thickness, t2, that is greater than the thickness, t1, of the device layer 12. The semiconductor layer 30 may include an inclined or sloped section that provides a thickness transition with the thinner device layer 12.

Germanium may laterally diffuse from the semiconductor layer 30 into the device layer 12 during the thermal oxidation process. A device area 23 may be defined that include a portion of the device layer 12 formerly considered part of the device area 24 that has received the laterally-diffused germanium. The formation of the device area 23 reduces the size of the device area 24, which remains free of germanium. The device area 23 of the device layer 12 is positioned laterally between the semiconductor layer 30 in the device area 22 and the remaining portion of the device layer 12 in the device area 24 that lacks germanium. The semiconductor layer 30 contains a uniform or substantially uniform concentration of germanium, and the device layer 12 in device area 24 does not contain (i.e., is free of) germanium. In an embodiment, the semiconductor layer 30 may have a germanium concentration in a range of 10 atomic percent to 60 atomic percent. In an embodiment, the semiconductor layer 30 may have a germanium concentration of around 15 atomic percent.

The germanium-containing portion of the device layer 12 in device area 23 adjoins the germanium-free portion of the device layer 12 in device area 24 along an interface 32 and adjoins the semiconductor layer 30 along another interface 33. The germanium-containing portion of the device layer 12 in device area 23 includes a graded concentration of germanium that ranges from a peak concentration equal to the concentration of germanium in the semiconductor layer 30 at the interface 33 to no germanium at the interface 32. The graded germanium composition decreases with increasing lateral distance from the portion of the device layer 12 located in device area 24 to the minimum value (i.e., zero) at the interface 32. The graded germanium concentration of the portion of the device layer 12 in device area 23 may have a maximum value that is equal or substantially equal to the uniform concentration of germanium in the semiconductor layer 30.

In an alternative embodiment, an annealing process may be used to cause additional diffusion of germanium from the semiconductor layer 30 laterally into the device layer 12, which may widen the device area 23. The annealing process would be a distinct process that is performed following the thermal oxidation process.

Figure 5:
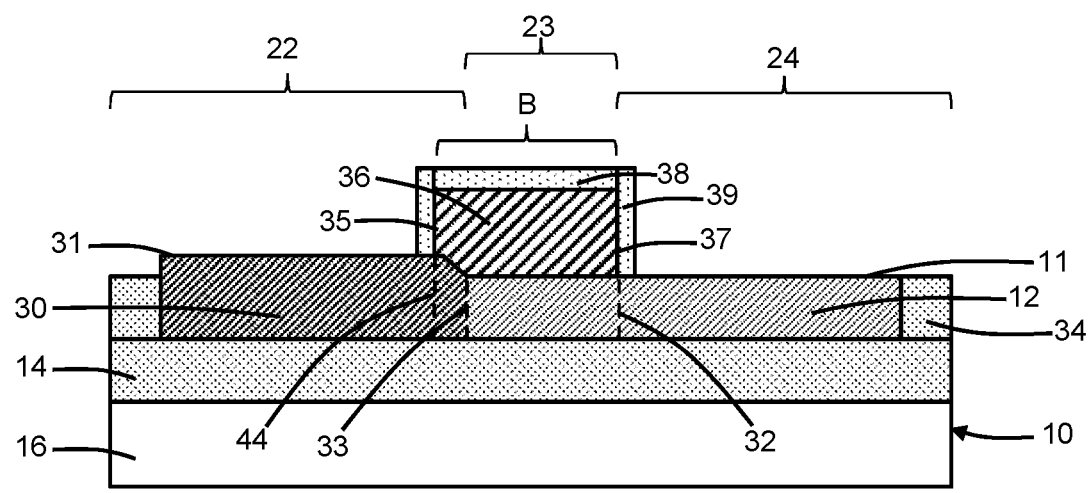

With reference to FIG. 5 in which like reference numerals refer to like features in FIG. 4 and at a subsequent fabrication stage, the remnant layer 28 and the pad layers 18, 20 may be removed by one or more etching processes after forming the semiconductor layer 30. Shallow trench isolation regions 34 may be formed that extend fully through the device layer 12 to the buried insulator layer 14 by etching trenches utilizing a hardmask, depositing a dielectric material, such as silicon dioxide, in the trenches, and planarizing with chemical-mechanical polishing. The shallow trench isolation regions 34 surround an active region that includes the semiconductor layer 30 in device area 22, the germanium-containing portion of the device layer 12 in device area 23, and the germanium-free portion of the device layer 12 in device area 23.

An extrinsic base 36 is formed that is positioned in part on the portion of the device layer 12 with the graded germanium concentration in device area 23 and in part on a portion of the semiconductor layer 30. The extrinsic base 36 may be patterned using lithography and etching processes from a deposited layer of a given material, such as a deposited layer of polycrystalline silicon (i.e., polysilicon). The extrinsic base 36 may be in situ doped during deposition with a dopant, such as a p-type dopant (e.g., boron), and may be more heavily doped with the dopant than the portion of the device layer 12 with the graded germanium concentration in device area 23 and the underlying portion of the semiconductor layer 30 in device area 23. The extrinsic base 36 is covered by a cap 38 that may represent a remnant of a hardmask used during patterning and that may be composed of silicon nitride.

The extrinsic base 36 includes a side surface 35 generally adjacent to the semiconductor layer 30 and a side surface 37 generally adjacent to the device layer 12 in the device area 24. The location of the extrinsic base 36 may be shifted laterally relative to the interface 32 between the semiconductor layer 30 in device area 22 and the device layer 12 in device area 24. In an embodiment, the interface 32 may be aligned with the side surface 37 of the extrinsic base 36.

The extrinsic base 36 may contact a portion of the semiconductor layer 30 and the device layer 12 in the device area 23 with the graded germanium concentration to define a base (B) of the lateral heterojunction bipolar transistor. The overlapped portions of the semiconductor layer 30 and the device layer 12 in the device area 23 may extend laterally from alignment with the side surface 35 of the extrinsic base 36 to alignment with the side surface 37 of the extrinsic base 36. The non-overlapped portion of the semiconductor layer 30 may provide a collector of the structure of the lateral heterojunction bipolar transistor, and the non-overlapped germanium-free portion of the device layer 12 in the device area 24 may provide an emitter of the structure of the lateral heterojunction bipolar transistor.

The portion of the device layer 12 participating in the base adjoins the portion of the device layer 12 defining the emitter along the interface 32. The portion of the device layer 12 participating in the base also adjoins the portion of the semiconductor layer 30 participating in the base along the interface 33. The portion of the semiconductor layer 30 participating in the base adjoins the portion of the semiconductor layer defining the collector at a junction 44. The junction 44 is located at the intersection between the base and collector, and another junction is defined at the interface 32 between the base and emitter. Due to layer thickness differences between the device layer and the semiconductor layer 30, the junction 44 defined at the intersection between the base and collector has a thickness that is greater than the thickness of the junction defined at the interface 32 between the base and emitter.

Sidewall spacers 39 are formed on the side surfaces 35, 37 of the extrinsic base 36. The sidewall spacers 39 may be formed by depositing a conformal layer composed of, for example, silicon nitride and etching the conformal layer with an anisotropic etching process.

After forming the extrinsic base 36 and sidewall spacers 39, the portion of the device layer 12 in device area 24 and the portion of the semiconductor layer 30 in the active region that are not covered by the extrinsic base 36 and sidewall spacers 39 may be doped by ion implantation. In an embodiment, ions of an n-type dopant (e.g., arsenic or phosphorus) may be implanted to provide n-type conductivity.

Middle-of-line (MOL) processing and back-end-of-line (BEOL) processing follow, which includes formation of silicide, contacts, vias, and wiring for an interconnect structure coupled with the lateral heterojunction bipolar transistor.

The transit frequency ($f_T$) of the lateral heterojunction bipolar transistor may be improved over conventional structures due to carrier acceleration arising from, among other factors, the grading of the composition in the base. The unequal thicknesses of the base-emitter junction and the base-collector junction, which gives rise to device asymmetry, may improve the gain of the lateral heterojunction bipolar transistor. The grading in the composition of the base of the lateral heterojunction bipolar transistor is provided before the extrinsic base is formed, which eliminates any need for a dummy structure as a placeholder for a replacement extrinsic base.

Figure 6:
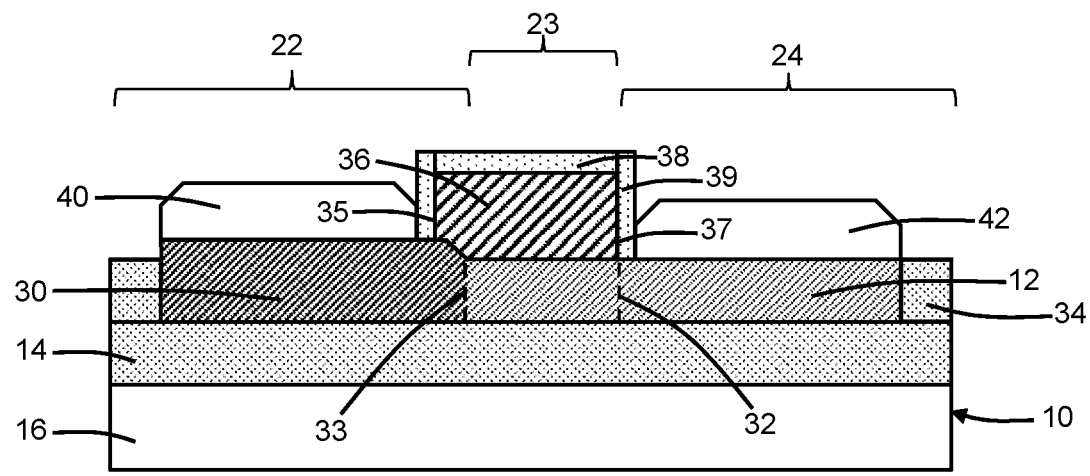
FIG. 6 is a cross-sectional view of a structure in accordance with alternative embodiments of the invention.

With reference to FIG. 6 in which like reference numerals refer to like features in FIG. 5 and in accordance with alternative embodiments, a raised semiconductor region 40 may be formed on the top surface 31 of the semiconductor layer 30 adjacent to one side surface 35 of the extrinsic base 36, and a raised semiconductor region 42 may be formed on the top surface 11 of the device layer 12 adjacent to the opposite side surface 37 of the extrinsic base 36. The raised semiconductor region 40 may be formed by epitaxial growth of semiconductor material from the top surface 31 of the semiconductor layer 30. The raised semiconductor region 42 may be formed by epitaxial growth of semiconductor material from the top surface 11 of the device layer 12. In an embodiment, the raised semiconductor regions 40, 42 may be concurrently formed by the same epitaxial growth process and therefore have the same composition. In an embodiment, the raised semiconductor regions 40, 42 may be composed of single-crystal silicon. In an embodiment, the raised semiconductor regions 40, 42 may be composed of single-crystal silicon-germanium. In an embodiment, the semiconductor material of the raised semiconductor regions 40, 42 may contain with a concentration of a dopant, such as an n-type dopant (e.g., phosphorus or arsenic) that provides n-type conductivity or a p-type dopant (e.g., boron) that provides p-type conductivity. In an embodiment, the raised semiconductor regions 40, 42 may be in situ doped with the dopant during epitaxial growth. In an embodiment, ions of the dopant may be implanted into undoped semiconductor material of the raised semiconductor regions 40, 42 or to increase the dopant level of raised semiconductor regions 40, 42 that are in situ doped during growth. A thermal treatment, such as a rapid thermal anneal, may be employed to improve the crystallinity of the epitaxially-grown semiconductor material contained in the raised semiconductor regions 40, 42 and for dopant activation.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a heterojunction bipolar transistor, the structure comprising:
   an emitter comprised of a first portion of a first semiconductor layer;
   a collector comprised of a first portion of a second semiconductor layer; and
   a base comprised of a second portion of the first semiconductor layer and a second portion of the second semiconductor layer that are laterally positioned between the first portion of the first semiconductor layer and the first portion of the second semiconductor layer,
   wherein the first portion of the first semiconductor layer has a first thickness, the first portion of the second semiconductor layer has a second thickness that is greater than the first thickness, the first portion and the second portion of the first semiconductor layer adjoin at a first junction having the first thickness, the first portion and the second portion of the second semiconductor layer adjoin at a second junction having the second thickness, the first portion and the second portion of the second semiconductor layer are comprised of silicon-germanium, and the second portion of the first semiconductor layer is comprised of silicon-germanium with a graded germanium concentration.

2. The structure of claim 1 wherein the graded germanium concentration increases with increasing lateral distance from the first portion of the first semiconductor layer.

3. The structure of claim 1 wherein the first portion and the second portion of the second semiconductor layer have a uniform concentration of germanium, and the graded germanium concentration of the second portion of the first semiconductor layer has a maximum value that is equal to the uniform concentration of germanium.

4. The structure of claim 3 wherein the graded germanium concentration decreases with increasing lateral distance from the second portion of the second semiconductor layer.

5. The structure of claim 4 wherein the first portion of the first semiconductor layer is free of germanium.

6. The structure of claim 1 wherein the first portion of the first semiconductor layer is free of germanium.

7. The structure of claim 1 wherein the first semiconductor layer and the second semiconductor layer are arranged over a buried insulating layer of a silicon-on-insulator substrate.

8. The structure of claim 1 further comprising:
   an extrinsic base positioned over the base, the extrinsic base directly connected to the second portion of the first semiconductor layer and the second portion of the second semiconductor layer.

9. The structure of claim 8 wherein the extrinsic base has a first side surface and a second side surface, the first side surface of the extrinsic base is aligned with the first junction, and the second side surface of the extrinsic base is aligned with the second junction.

10. The structure of claim 1 further comprising:
    a first raised semiconductor layer on the first portion of the first semiconductor layer; and
    a second raised semiconductor layer on the second portion of the second semiconductor layer.

11. The structure of claim 10 wherein the first raised semiconductor layer and the second raised semiconductor layer are comprised of the same semiconductor material.

12. A structure for a heterojunction bipolar transistor, the structure comprising:
    an emitter comprised of a first portion of a first semiconductor layer;
    a collector comprised of a first portion of a second semiconductor layer; and
    a base comprised of a second portion of the first semiconductor layer and a second portion of the second semiconductor layer that are laterally positioned between the first portion of the first semiconductor layer and the first portion of the second semiconductor layer, wherein the first portion of the first semiconductor layer has a first thickness, the first portion of the second semiconductor layer has a second thickness that is greater than the first thickness, the first portion and the second portion of the first semiconductor layer adjoin at a first junction having the first thickness, the first portion and the second portion of the second semiconductor layer adjoin at a second junction having the second thickness, and the first portion and the second portion of the first semiconductor layer and the first portion and the second portion of the second semiconductor layer are arranged in direct contact with a buried insulating layer of a silicon-on-insulator substrate.

13. The structure of claim 12 wherein the first portion and the second portion of the second semiconductor layer are comprised of silicon-germanium, and the second portion of the first semiconductor layer is comprised of silicon-germanium with a graded germanium concentration.

14. The structure of claim 13 wherein the graded germanium concentration increases with increasing lateral distance from the first portion of the first semiconductor layer.

15. The structure of claim 13 wherein the first portion and the second portion of the second semiconductor layer have a uniform concentration of germanium, and the graded germanium concentration of the second portion of the first semiconductor layer has a maximum value that is equal to the uniform concentration of germanium.

16. The structure of claim 15 wherein the graded germanium concentration decreases with increasing lateral distance from the second portion of the second semiconductor layer.

17. The structure of claim 16 wherein the first portion of the first semiconductor layer is free of germanium.

18. The structure of claim 12 wherein the first portion of the first semiconductor layer is free of germanium.

19. The structure of claim 12 further comprising:
an extrinsic base positioned over the base, the extrinsic base directly connected to the second portion of the first semiconductor layer and the second portion of the second semiconductor layer, the extrinsic base having a first side surface and a second side surface, the first side surface of the extrinsic base aligned with the first junction, and the second side surface of the extrinsic base aligned with the second junction.

20. The structure of claim 12 further comprising:
a first raised semiconductor layer on the first portion of the first semiconductor layer; and
a second raised semiconductor layer on the second portion of the second semiconductor layer,
wherein the first raised semiconductor layer and the second raised semiconductor layer are comprised of the same semiconductor material.

* * * * *